(12) United States Patent
Sun (10) Patent No.: US 10,693,458 B2
(45) Date of Patent: Jun. 23, 2020

(54) SWITCH CIRCUIT AND METHOD OF OPERATING THE SAME

(71) Applicant: SUPER MICRO COMPUTER, INC., San Jose, CA (US)

(72) Inventor: Shih-Chen Sun, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 16/036,529

(22) Filed: Jul. 16, 2018

(65) Prior Publication Data

US 2020/0021288 A1   Jan. 16, 2020

(51) Int. Cl.
*H03K 17/687* (2006.01)
*H01R 12/73* (2011.01)

(52) U.S. Cl.
CPC ....... *H03K 17/6872* (2013.01); *H01R 12/737* (2013.01)

(58) Field of Classification Search
CPC ............. H03K 17/6872; H03K 17/693; H03K 17/005; H03K 5/1252; H03K 5/135; H02J 1/10; H02J 9/061; H02J 7/0024; H02M 3/158; G05F 1/62; G06F 1/26; G06F 1/08
See application file for complete search history.

(56) References Cited

U.S. PATENT DOCUMENTS 7,531,913 B2 *   5/2009   Liu ............................ H02J 1/08
                                                         307/31
7,830,044 B2 * 11/2010   Tai ............................ G06F 1/26
                                                        307/154

* cited by examiner

*Primary Examiner* — Long Nguyen
(74) *Attorney, Agent, or Firm* — WPAT, P.C., Intellectual Property Attorneys; Anthony King (57) ABSTRACT

A switch circuit includes a first conductive terminal configured to receive a first signal from a first pin of a connector, a second conductive terminal configured to receive a second signal from a second pin of the connector, a third conductive terminal electrically connected to a third pin of the connector, and a fourth conductive terminal electrically connected to a fourth pin of the connector. The third conductive terminal outputs a first power signal of a first voltage level to the third pin of the connector upon receiving the first signal, and the fourth conductive terminal outputs a second power signal of a second voltage level to the fourth pin of the connector upon receiving the second signal.

20 Claims, 10 Drawing Sheets

SWITCH CIRCUIT AND METHOD OF OPERATING THE SAME

TECHNICAL FIELD

The present disclosure generally relates to a switch circuit, and specifically relates to a switch circuit for electronic devices and a method of operating the same.

BACKGROUND

As technology advances, new products enter the market every day. Sometimes these advancements are in the form of incremental changes to a product over time. Newer models may differ from preceding ones in certain parameters, such as power consumption. Performance of the device may be adversely affected if the new parameters create new technical requirements that are not fulfilled.

SUMMARY

In accordance with some embodiments of the present disclosure, a switch circuit includes a first conductive terminal, second conductive terminal, a third conductive terminal, and a fourth conductive terminal. The first conductive terminal is configured to receive a first signal from a first pin of a connector. The second conductive terminal is configured to receive a second signal from a second pin of the connector. The third conductive terminal is electrically connected to a third pin of the connector. The fourth conductive terminal is electrically connected to a fourth pin of the connector. The third conductive terminal outputs a first power signal of a first voltage level to the third pin of the connector upon receiving the first signal, and the fourth conductive terminal outputs a second power signal of a second voltage level to the fourth pin of the connector upon receiving the second signal. The second voltage level is different from the first voltage level.

In accordance with some embodiments of the present disclosure, a method of operating a switch circuit. The method includes: receiving, at a first conductive terminal of the switch circuit, a first signal from a first pin of a connector; receiving, at a second conductive terminal of the switch circuit, a second signal from a second pin of the connector; outputting, at a third conductive terminal of the switch circuit, a first power signal of a first voltage level to a third pin of the connector upon receiving the first signal, and outputting, at a fourth conductive terminal of the switch circuit, a second power signal of a second voltage level to a fourth pin of the connector upon receiving the second signal. The second voltage level is different from the first voltage level.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

DETAILED DESCRIPTION

Embodiments of the present disclosure and use thereof are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed herein.

Therefore, there is a need for developing a mechanism to address the issue of incompatibility between different models of a device (e.g. between a legacy model and a next generation model).

Figure 1A:
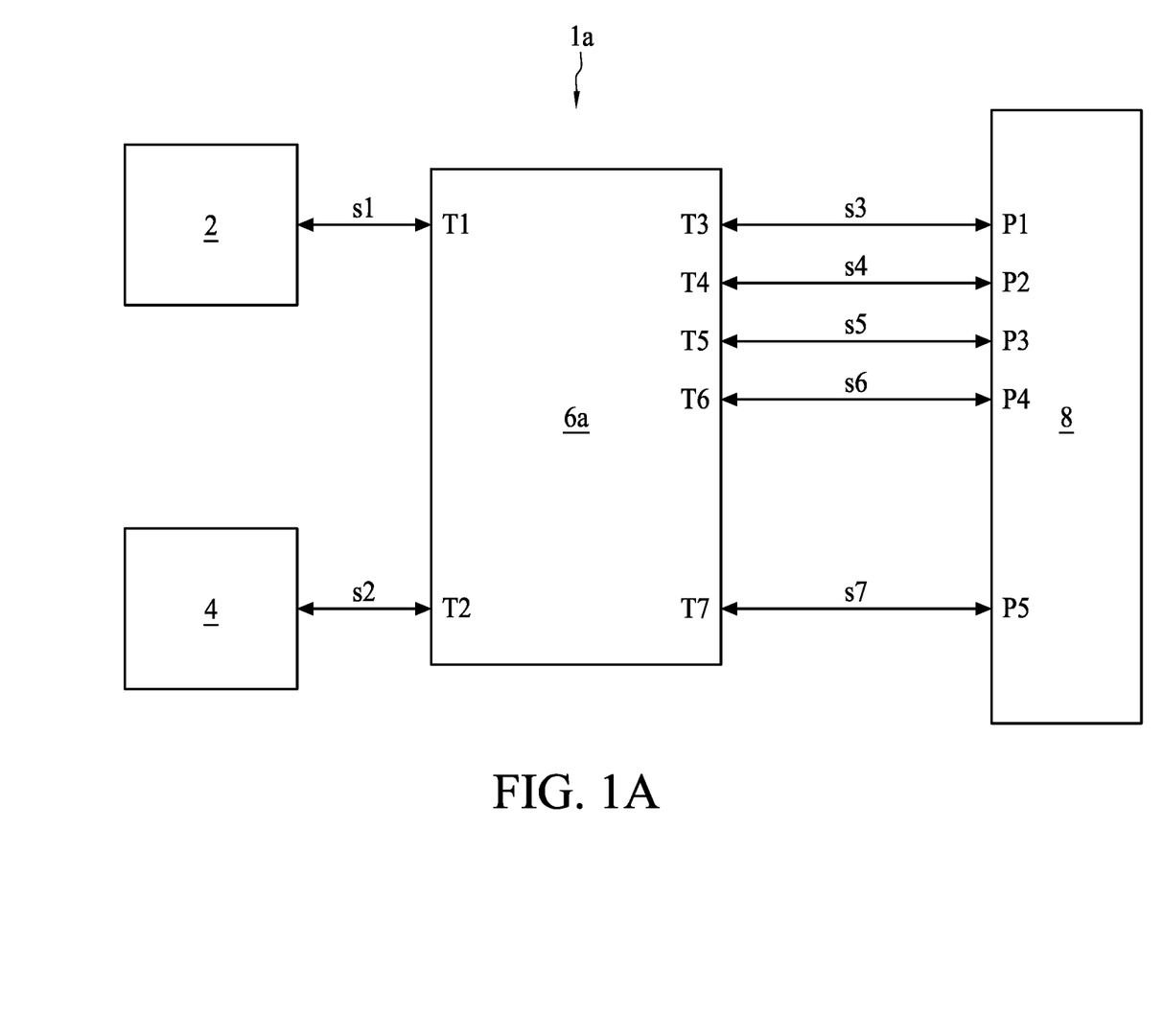
FIG. 1A is a schematic diagram illustrating a system according to some embodiments of the present disclosure.

FIG. 1A is a schematic diagram illustrating a system according to some embodiments of the present disclosure. As shown in FIG. 1A, a system 1a includes a power source unit or power supply unit 2, a processing unit 4, a switch circuit 6a and a connector 8.

The system 1 may be integrated on a circuit board (for example, a printed circuit board (PCB)). In some embodiments of the present disclosure, the system 1a may be disposed on some disaggregated circuit boards; for example, the power supply unit 2 may be disposed on a first circuit board, and the processing unit 4 may be disposed on a second circuit board separated from the first circuit board and electrically connected to the first circuit board.

The power supply unit 2 may include but is not limited to, for example, an AC-DC power supply, a DC-DC power supply, a programmable power supply (CVCC) or the like. The power supply unit 2 provides power signals of various voltage levels. For example, the power supply unit 2 provides power signals of a voltage level ranging from 1.8 Volts (V) to 12V. The power supply unit 2 outputs power signal of a voltage level of 1.8V. The power supply unit 2 outputs power signal of a voltage level of 3.3V. The power supply unit 2 outputs power signal of a voltage level of 12V. The power supply unit 2 is electrically connected to the switch circuit 6a. The power supply unit 2 is electrically connected to the processing unit 4. The power supply unit 2 is electrically connected to the connector 8. The power supply unit 2 supplies or outputs power signal(s) to the switch circuit 6a.

The processing unit 4 may include but is not limited to, for example, a central processing unit (CPU), a microprocessor, an application-specific instruction set processor (ASIP), a graphics processing unit (GPU), a physics processing unit (PPU), a digital signal processor (DSP), an image processor, a coprocessor, a floating-point unit, a network processor, a multi-core processor, a front-end processor or the like. The processing unit 4 is electrically connected to the switch circuit 6a. The processing unit 4 is electrically connected to the power supply unit 2. The processing unit 4 is electrically connected to the connector 8.

The connector 8 may include but is not limited to, for example, a socket, a slot, an engagement mechanism or the like. The connector 8 may include a memory card connector, which includes an insulating housing defining conductive terminal grooves and two locating grooves at a sidewall thereof. A shelter shell is coupled with the insulating housing to form a (card) cavity. The connector 8 may include one or more anti-mismating portions. The anti-mismating portions have different width and vertical length. The connector 8 may include conductive terminals fixed in the conductive terminal grooves and soldered to a circuit board (e.g. PCB) for electrically engaging with corresponding contacts of an electronic device (e.g. a memory (card) inserted into the cavity. The connector 8 is electrically connected to the switch circuit 6a. The connector 8 is electrically connected to the processing unit 4. The connector 8 is electrically connected to the power supply unit 2. The connector 8 includes conductive pins P1, P2, P3, P4 and P5. The switch circuit 6a may include more or fewer conductive pins in some other embodiments of the present disclosure, which are not illustrated for simplicity.

The switch circuit 6a includes conductive terminals T1, T2, T3, T4, T5, T6 and T7. The switch circuit 6a may include more or fewer conductive terminals in some other embodiments of the present disclosure, which are not illustrated for simplicity.

The conductive terminal T1 is electrically connected to the power supply unit 2. The conductive terminal T1 illustrated in FIG. 1A includes only a single connection for the sake of simplicity; however, it is contemplated that there could be more connections between the power supply unit 2 and the switch circuit 6a for signal transmission (e.g. transmission of power signals of various voltage levels).

The conductive terminal T2 of the switch circuit 6a is electrically connected to the processing unit 4. The conductive terminal T3 of the switch circuit 6a is electrically connected to the pin P1 of the connector 8. The conductive terminal T4 of the switch circuit 6a is electrically connected to the pin P2 of the connector 8. The conductive terminal T5 of the switch circuit 6a is electrically connected to the pin P3 of the connector 8. The conductive terminal T6 of the switch circuit 6a is electrically connected to the pin P4 of the connector 8. The conductive terminal T7 of the switch circuit 6a is electrically connected to the pin P5 of the connector 8.

The conductive terminal T1 of the switch circuit 6a is configured to receive a power signal s1 from the power supply unit 2.

A signal s2 is transmitted between the conductive terminal T2 of the switch circuit 6a and the processing unit 4.

A signal s3 is transmitted between the conductive terminal T3 of the switch circuit 6a and pin P1 of the connector 8.

A signal s5 is transmitted between the conductive terminal T5 of the switch circuit 6a and pin P3 of the connector 8.

The conductive terminal T4 of the switch circuit 6a is configured to provide a power signal s4 to the pin P2 of the connector 8.

The conductive terminal T6 of the switch circuit 6a is configured to provide a power signal s6 to the pin P4 of the connector 8.

A signal s7 is transmitted between the conductive terminal T7 of the switch circuit 6a and the connector 8.

The conductive terminal T4 of the switch circuit 6a outputs the power signal s4 to the pin P2 of the connector 8 upon receiving the signal s3 from the pin P1 of the connector 8. The conductive terminal T6 of the switch circuit 6a outputs the power signal s6 to the pin P4 of the connector 8 upon receiving the signal s5 from the pin P3 of the connector 8. The power signal s4 has a voltage level different from the voltage of the power signal s6.

The switch circuit 6a is configured to change a voltage level of the signal s7 transmitted between the switch circuit 6a and the connector 8 upon receiving the signal s5 from the pin P3 of the connector 8.

The conductive terminal T4 of the switch circuit 6a outputs the power signal s4 to the pin P2 of the connector 8 when the signal s3 received from the pin P1 of the connector 8 is a signal of a ground level or a relatively low voltage level.

The conductive terminal T6 of the switch circuit 6a outputs the power signal s6 to the pin P4 of the connector 8 when the signal s5 received from the pin P3 of the connector 8 is a signal of a ground level or a relatively low voltage level.

The switch circuit 6a is configured to change a voltage level of the signal s7 when the signal s5 received from the pin P3 of the connector 8 is a signal of a ground level or a relatively low voltage level.

The power signal s4 has a voltage level different from a voltage level of the power signal s6. The power signal s4 has a voltage level lower than a voltage level of the power signal s6. The power signal s4 may have a voltage level of approximately 3.3 V. The power signal s6 may have a voltage level of approximately 12 V.

Figure 1B:
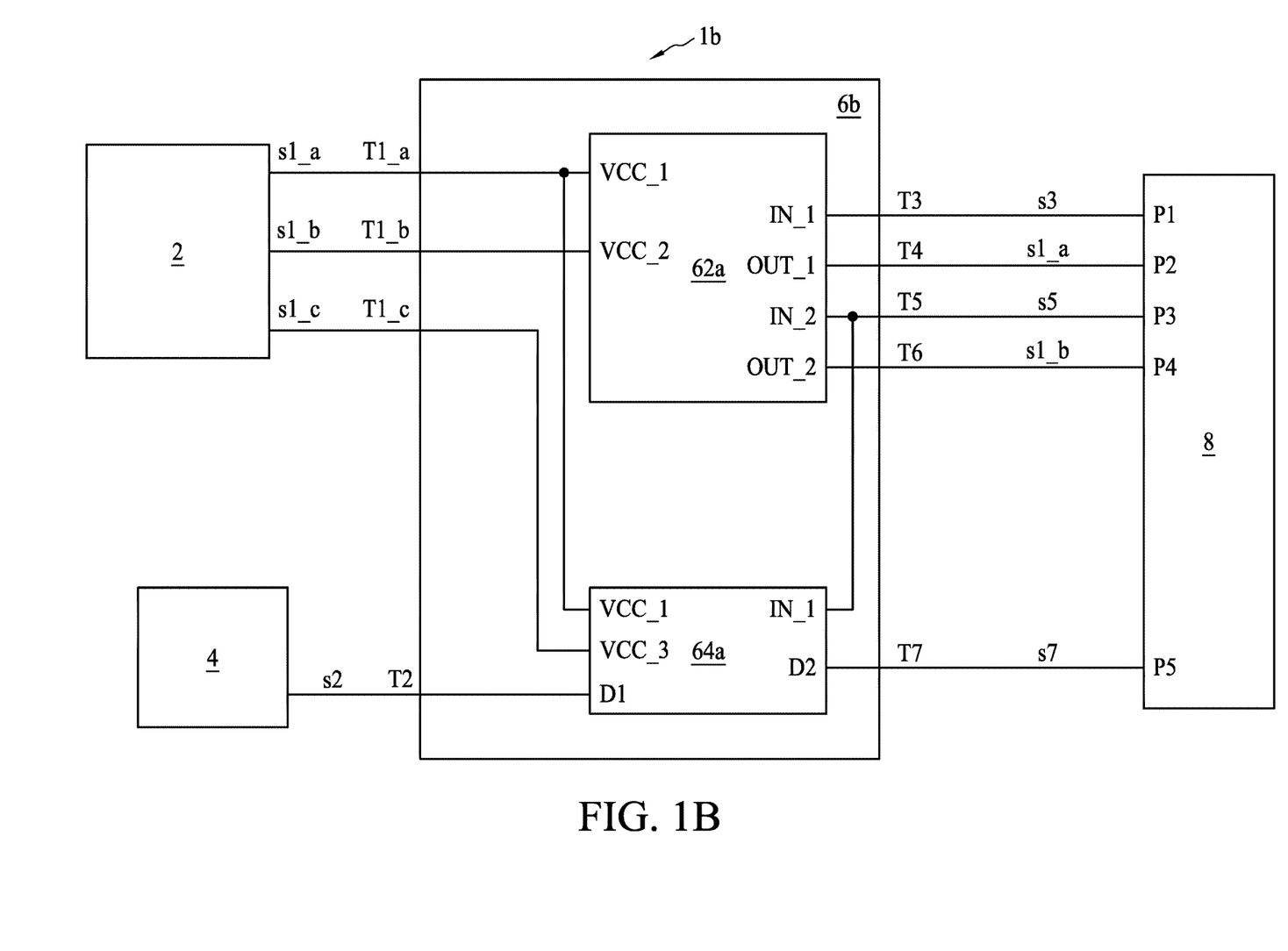
FIG. 1B is a schematic diagram illustrating another system according to some embodiments of the present disclosure.

FIG. 1B is a schematic diagram illustrating a system according to some embodiments of the present disclosure. The system 1b shown in FIG. 1B is identical or similar to the system 1a as described and illustrated with reference to FIG.

1A. In some embodiments, the system 1*b* shown in FIG. 1B is different from the system 1*a* as described and illustrated with reference to FIG. 1A.

The switch circuit 6*b* shown in FIG. 1B is identical or similar to the switch circuit 6*a* as described and illustrated with reference to FIG. 1A. In some embodiments, the switch circuit 6*b* shown in FIG. 1B is different from the switch circuit 6*a* as described and illustrated with reference to FIG. 1A.

Referring to FIG. 1B, the switch circuit 6*b* includes a switch circuit 62*a* and a switch circuit 64*a*.

The switch circuit 62*a* includes conductive terminals VCC_1, VCC_2, IN_1, OUT_1, IN_2 and OUT_2. Though not illustrated, it is contemplated that the switch circuit 62*a* may include more or fewer conductive terminals.

The conductive terminal VCC_1 of the switch circuit 62*a* is electrically connected to the power supply unit 2. The conductive terminal VCC_1 of the switch circuit 62*a* is electrically connected to a conductive terminal T1_*a* of the switch circuit 6*b*.

The conductive terminal VCC_2 of the switch circuit 62*a* is electrically connected to the power supply unit 2. The conductive terminal VCC_2 of the switch circuit 62*a* is electrically connected to a conductive terminal T1_*b* of the switch circuit 6*b*.

The conductive terminal IN_1 of the switch circuit 62*a* is electrically connected to the pin P1 of the connector 8. The conductive terminals IN_1 of the switch circuit 62*a* is electrically connected to the conductively terminal T3 of the switch circuit 6*b*.

The conductive terminal OUT_1 of the switch circuit 62*a* is electrically connected to the pin P2 of the connector 8. The conductive terminals OUT_1 of the switch circuit 62*a* is electrically connected to the conductively terminal T4 of the switch circuit 6*b*.

The conductive terminal IN_2 of the switch circuit 62*a* is electrically connected to the pin P3 of the connector 8. The conductive terminals IN_2 of the switch circuit 62*a* is electrically connected to the conductively terminal T5 of the switch circuit 6*b*.

The conductive terminal OUT_2 of the switch circuit 62*a* is electrically connected to the pin P4 of the connector 8. The conductive terminals OUT_2 of the switch circuit 62*a* is electrically connected to the conductively terminal T6 of the switch circuit 6*b*.

The conductive terminal VCC_1 of the switch circuit 62*a* receives a power signal s1_*a* from the power supply unit 2. The conductive terminal VCC_2 of the switch circuit 62*a* receives a power signal s1_*b* from the power supply unit 2. The conductive terminal OUT_1 of the switch circuit 62*a* outputs the power signal s1_*a* to the pin P2 of the connector when or after a signal s3 is received from the pin P1 of the connector 8. The conductive terminal OUT_2 of the switch circuit 62*a* outputs the power signal s1_*b* to the pin P4 of the connector when or after a signal s5 is received from the pin P3 of the connector 8.

The conductive terminal OUT_1 of the switch circuit 62*a* outputs the power signal s1_*a* to the pin P2 of the connector when the signal s3 received from the pin P1 of the connector 8 is a signal of a ground voltage level or a relatively low voltage level. The conductive terminal OUT_2 of the switch circuit 62*a* outputs the power signal s1_*b* to the pin P4 of the connector 8 when the signal s5 received from the pin P3 of the connector 8 is a signal of a ground voltage level or a relatively low voltage level.

The power signal s1_*a* has a voltage level different from a voltage level of the power signal s1_*b*. The power signal s1_*a* has a voltage level lower than a voltage level of the power signal s1_*b*. The power signal s1_*a* may have a voltage level of approximately 3.3 V. The power signal s1_*b* may have a voltage level of approximately 12 V.

The switch circuit 64*a* includes conductive terminals VCC_1, VCC_3, D1, IN_1 and D2.

The conductive terminal VCC_1 of the switch circuit 64*a* is electrically connected to the power supply unit 2. The conductive terminal VCC_1 of the switch circuit 64*a* is electrically connected to the conductive terminal T1_*a* of the switch circuit 6*b*.

The conductive terminal VCC_3 of the switch circuit 64*a* is electrically connected to the power supply unit 2. The conductive terminal VCC_3 of the switch circuit 64*a* is electrically connected to a conductive terminal T1_*c* of the switch circuit 6*b*.

The conductive terminal D1 of the switch circuit 64*a* is electrically connected to the processing unit 4. The conductive terminal D1 of the switch circuit 64*a* is electrically connected to the conductive terminal T2 of the switch circuit 6*b*.

The conductive terminal D2 of the switch circuit 64*a* is electrically connected to the pin P5 of the connector 8. The conductive terminal D2 of the switch circuit 64*a* is electrically connected to the conductive terminal T7 of the switch circuit 6*b*.

The conductive terminal IN_1 of the switch circuit 64*a* is electrically connected to the pin P3 of the connector 8. The conductive terminal IN_1 of the switch circuit 64*a* is electrically connected to the conductive terminal T5 of the switch circuit 6*b*.

The conductive terminal VCC_1 of the switch circuit 64*a* receives a power signal s1_*a* from the power supply unit 2.

The conductive terminal VCC_3 of the switch circuit 64*a* receives a power signal s1_*c* from the power supply unit 2.

The power signal s1_*a* has a voltage level different from a voltage level of the power signal s1_*c*. The power signal s1_*a* has a voltage level higher than a voltage level of the power signal s1_*c*. The power signal s1_*a* may have a voltage level of approximately 3.3 V. The power signal s1_*c* may have a voltage level of approximately 1.8 V.

The switch circuit 64*a* is configured to provide transmission of a signal s2 between the processing unit 4 and the switch circuit 6*b*. The switch circuit 64*a* is further configured to provide transmission of a signal s7 between the switch circuit 6*b* and the connector 8. The switch circuit 64*a* is configured to change a voltage level of the signal s7 upon receiving the signal s5 at the conductive terminal IN_1 of the switch circuit 64*a*. The switch circuit 64*a* is configured to change a voltage level of the signal s7 upon receiving the signal s5 at the T5 of the switch circuit 6*b*. The voltage level of the signal s7 is changed from a relatively low voltage level to a relatively high voltage level. The voltage level of the signal s7 may be changed from 1.8 V to 3.3 V.

Figure 2:
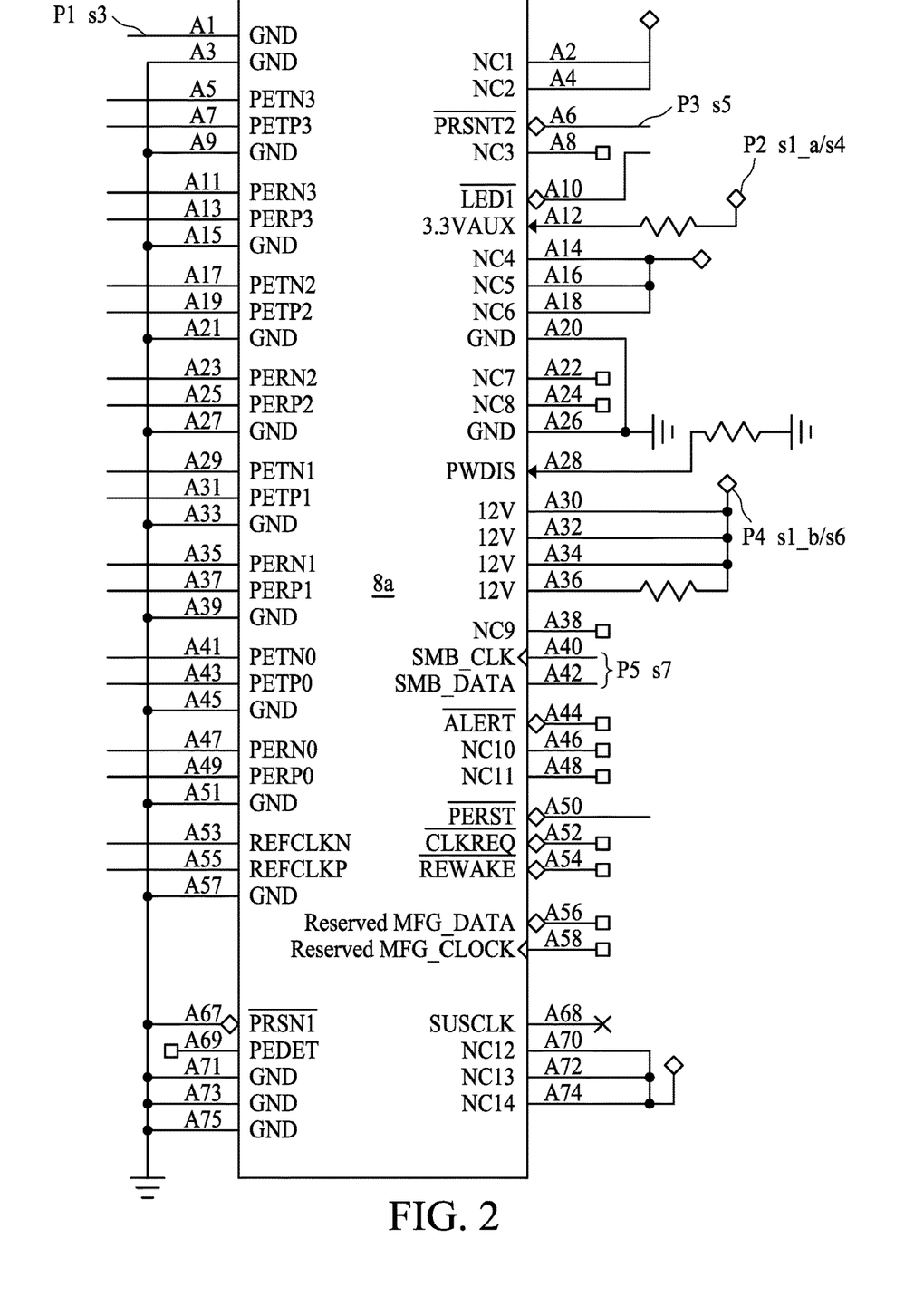
FIG. 2 is a schematic diagram illustrating a connector according to some embodiments of the present disclosure.

FIG. 2 is a schematic diagram illustrating a connector according to some embodiments of the present disclosure. The connector 8*a* shown in FIG. 2 is identical or similar to the connector 8 as illustrated and described with reference to FIG. 1A or FIG. 1B. In some embodiments, the connector 8*a* shown in FIG. 2 is different from the connector 8 as illustrated and described with reference to FIG. 1A or FIG. 1B.

Referring to FIG. 2, the connector 8*a* includes a plurality of pins for electrically engaging with corresponding contacts of an electronic device when the connector 8*a* receives the electronic device. The electronic device may include but is not limited to, for example, an M.2 solid state drive (SSD)

SSD or a Next Generation Small Form Factor (NGSFF) SSD. An NGSFF SSD is a next generation device of an M.2 SSD. An NGSFF SSD may work at a power signal of approximately 3.3 V. An NGSFF SSD may work at a power signal of approximately 12 V. An M.2 SSD may work at a power signal of approximately 3.3 V. An NGSFF SSD may receive or transmit a sideband signal of approximately 3.3 V. An M.2 SSD may receive or transmit a sideband signal of approximately 1.8 V.

When no electronic device is inserted in or engaged with the connector 8a, a signal s3 having a default high voltage is provided to the pin P1. When no electronic device is inserted in or engaged with the connector 8a, a signal s3 having a relatively high voltage is provided to the pin P1.

Once an electronic device is inserted in or engaged with the connector 8a, the voltage level of the signal s3 is pulled down to a relatively low voltage level (e.g. ground voltage level). Change of the signal s3 at the pin P1 can be used (by the switch circuit 6a or 6b) to determine whether an electronic device is present or engaged.

When no electronic device is inserted in or engaged with (or received by) the connector 8a, a signal s5 having a floating voltage level (or a relatively high voltage level) is provided at the pin P3. When or after the connector 8a receives an electronic device of a first type (e.g. an NGSFF SSD), the voltage level of the signal s5 will be pulled down to a relatively low voltage level (e.g. ground voltage level). When or after the connector 8a receives an electronic device of a second type (e.g. an M.2 SSD), the voltage level of the signal s5 remains at a relatively high voltage level.

The pin P2 is configured to receive a power signal $s1\_a$. The power signal $s1\_a$ may have a voltage level of 3.3 V.

The pin P4 is configured to receive a power signal $s1\_b$. The power signal $s1\_b$ may have a voltage level of 12 V.

A power signal of relatively high voltage level (e.g. 12V) may damage an M.2 SSD. A sideband signal of relatively high voltage level (e.g. 3.3V) may damage an M.2 SSD.

The pin P5 of the connector 8a is configured to transmit a signal s7 to the processing unit 4. The pin P5 of the connector 8a is configured to receive a signal s7 from the processing unit 4. The signal s7 may include but is not limited to information associated with model name, serial number, temperature, power consumption, or capability of the electronic device that is received by the connector 8a.

Figure 3:
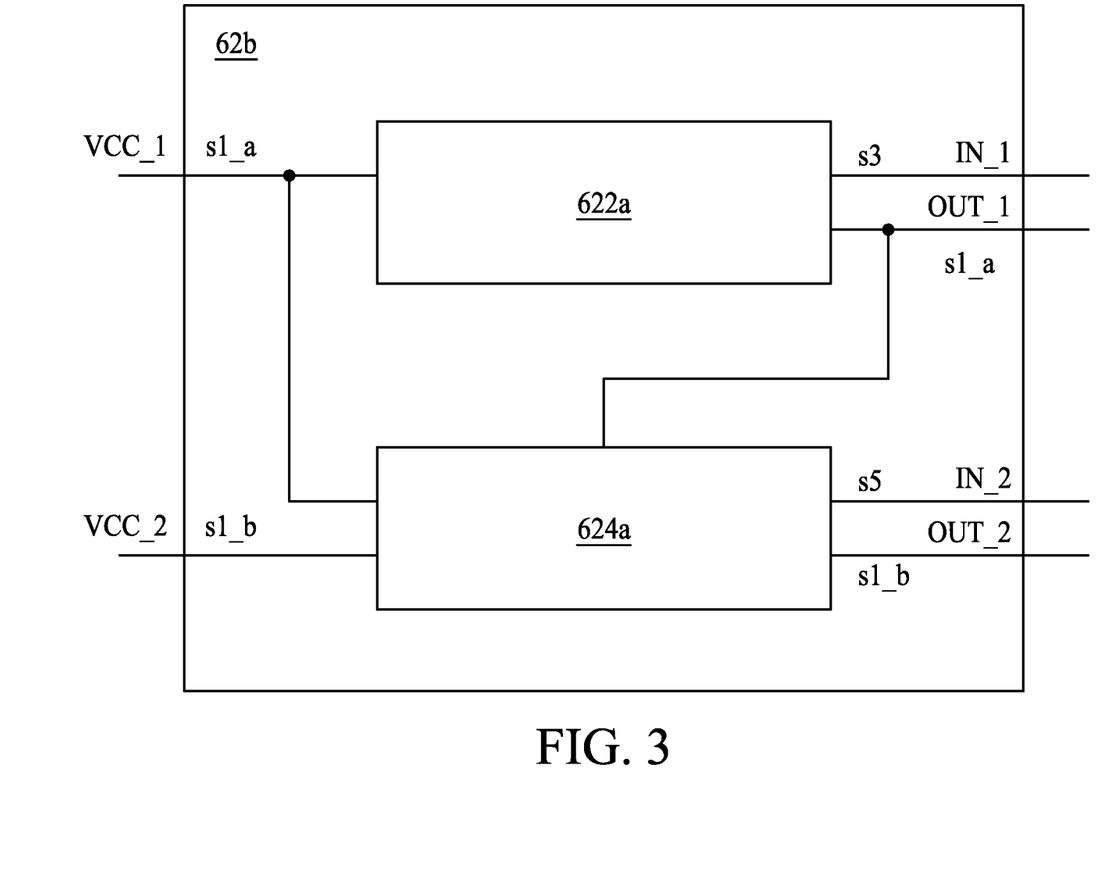
FIG. 3 is a schematic diagram illustrating a switch circuit according to some embodiments of the present disclosure.

FIG. 3 is a schematic diagram illustrating a switch circuit according to some embodiments of the present disclosure. The switch circuit 62b shown in FIG. 3 is identical or similar to the switch circuit 62a as described and illustrated with reference to FIG. 1B. In some embodiments, the switch circuit 62b shown in FIG. 3 is different from the switch circuit 62a as described and illustrated with reference to FIG. 1B.

Referring to FIG. 3, the switch circuit 62b includes a switch module 622a and another switch module 624a.

The switch module 622a is electrically connected to a conductive terminal VCC_1 of the switch circuit 62b. The switch module 622a is electrically connected to a conductive terminal IN_1 of the switch circuit 62b. The switch module 622a is electrically connected to a conductive terminal OUT_1 of the switch circuit 62b.

The switch module 624a is electrically connected to a conductive terminal VCC_1 of the switch circuit 62b. The switch module 624a is electrically connected to a conductive terminal VCC_2 of the switch circuit 62b. The switch module 624a is electrically connected to a conductive terminal IN_2 of the switch circuit 62b. The switch module 624a is electrically connected to a conductive terminal OUT_2 of the switch circuit 62b.

The switch module 622a receives a power signal $s1\_a$ from conductive terminal VCC_1 of the switch circuit 62b. The switch module 622a outputs a power signal $s1\_a$ to the conductive terminal OUT_1 of the switch circuit 62b upon receiving a signal s3 from the conductive terminal IN_1 of the switch circuit 62b.

The switch module 624a receives a power signal $s1\_a$ from the conductive terminal VCC_1 of the switch circuit 62b. The switch module 624a receives a power signal $s1\_b$ from the conductive terminal VCC_2 of the switch circuit 62b. The power signal $s1\_a$ outputted by the switch module 622a may enable the switch module 624a. The switch module 624a outputs the power signal $s1\_b$ to the conductive terminal OUT_2 of the switch circuit 62b in response to a signal s5 which is received from the conductive terminal IN_2 of the switch circuit 62b.

Figure 3A:
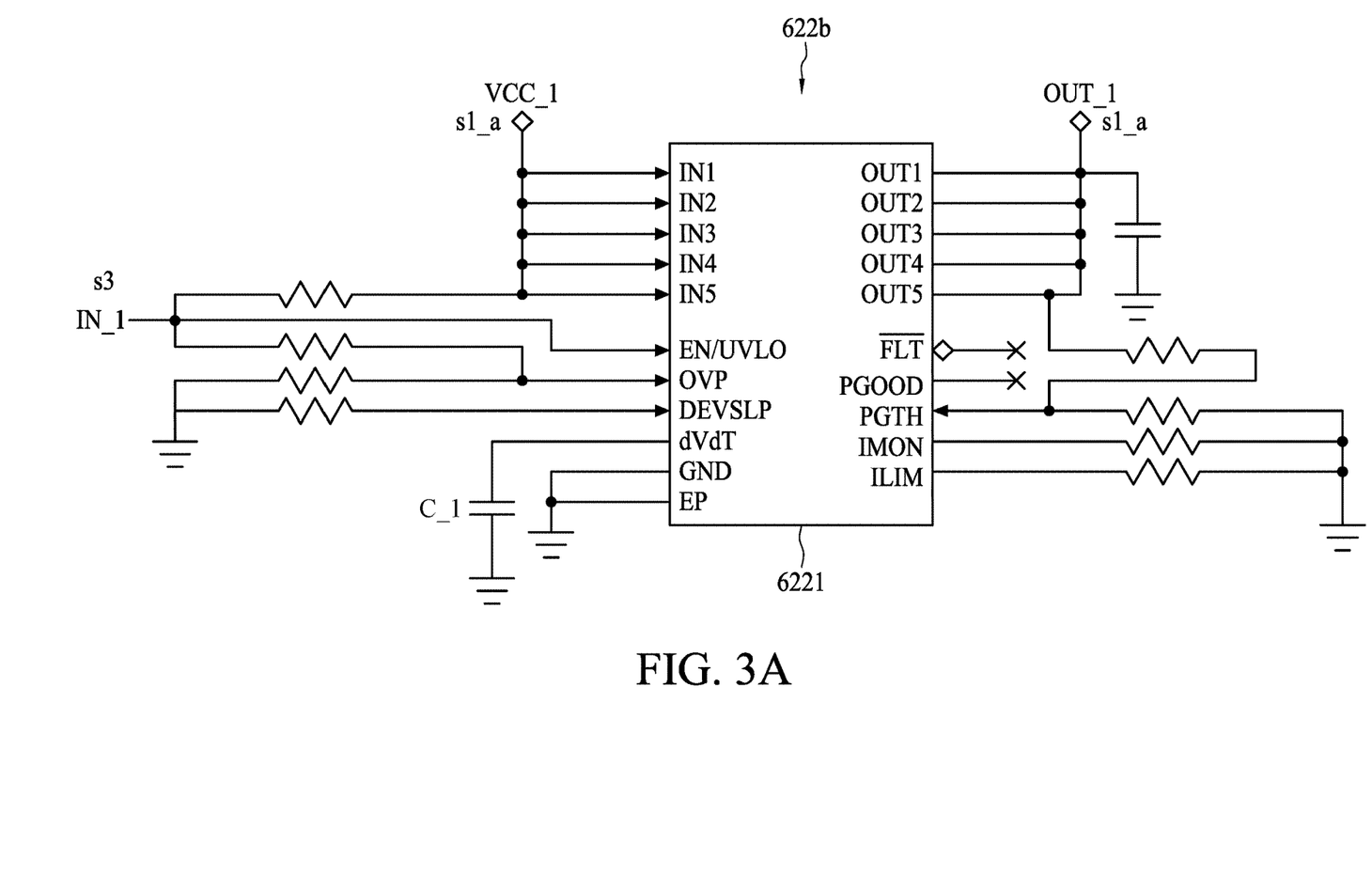
FIG. 3A is a schematic diagram illustrating a switch module according to some embodiments of the present disclosure.

FIG. 3A is a schematic diagram illustrating a switch module according to some embodiments of the present disclosure. The switch module 622b shown in FIG. 3A is identical or similar to the switch module 622a as described and illustrated with reference to FIG. 3. In some embodiments, the switch module 622b shown in FIG. 3A is different from the switch module 622a as described and illustrated with reference to FIG. 3.

Referring to FIG. 3A, the switch module 622b includes a plurality of conductive terminals. The switch module 622b includes a control logic 6221. The conductive terminal VCC_1 of the switch module 622b is configured to receive a power signal $s1\_a$ from the power supply unit 2. The conductive terminal IN_1 of the switch module 622b is configured to receive a signal s3 from the pin P1 of the connector 8. The conductive terminal OUT_1 of the switch module 622b is configured to output the power signal $s1\_a$ to the pin P2 of the connector 8.

The switch module 622b includes a capacitor C_1 electrically connected to a conductive terminal dVdT of the switch module 622b. The capacitor C_1 is used to control the rise time of the power signal $s1\_a$ outputted to the pin P2 of the connector 8.

The capacitance of the capacitor C_1 is designed to comply with a standard or specification of an electronic device. The capacitance of the capacitor C_1 is designed to be compatible with the rise time for different electronic devices. The capacitance of the capacitor C_1 is designed to be compatible with different rise times defined in the specifications of NGSFF SSD and M.2 SSD. For example, in an M.2 SSD, the rise time of a received power signal may be defined to be greater than 1 millisecond (ms). For example, in an NGSFF SSD, the rise time of a received power signal may be defined to be greater than 1 millisecond. In some embodiments of the subject application, the capacitor C_1 has a capacitance of approximately 1.5 nanofarads (nF). In some embodiments of the subject application, the capacitor C_1 has a capacitance to control/facilitate the power signal $s1\_a$ to have a rise time of approximately 1.5 milliseconds. The capacitor C_1 has a capacitance to control/facilitate the power signal $s1\_a$ to have a rise time which meets the criteria or standard defined in the specification of NGSFF SSD. The capacitor C_1 has a capacitance to control/facilitate the power signal $s1\_a$ to have a rise time which meets the criteria or standard defined in the specification of M.2 SSD. In some embodiments, the control logic 6221 is an eFuse component that can provide over-voltage protection and/or over-current protection.

Figure 3B:
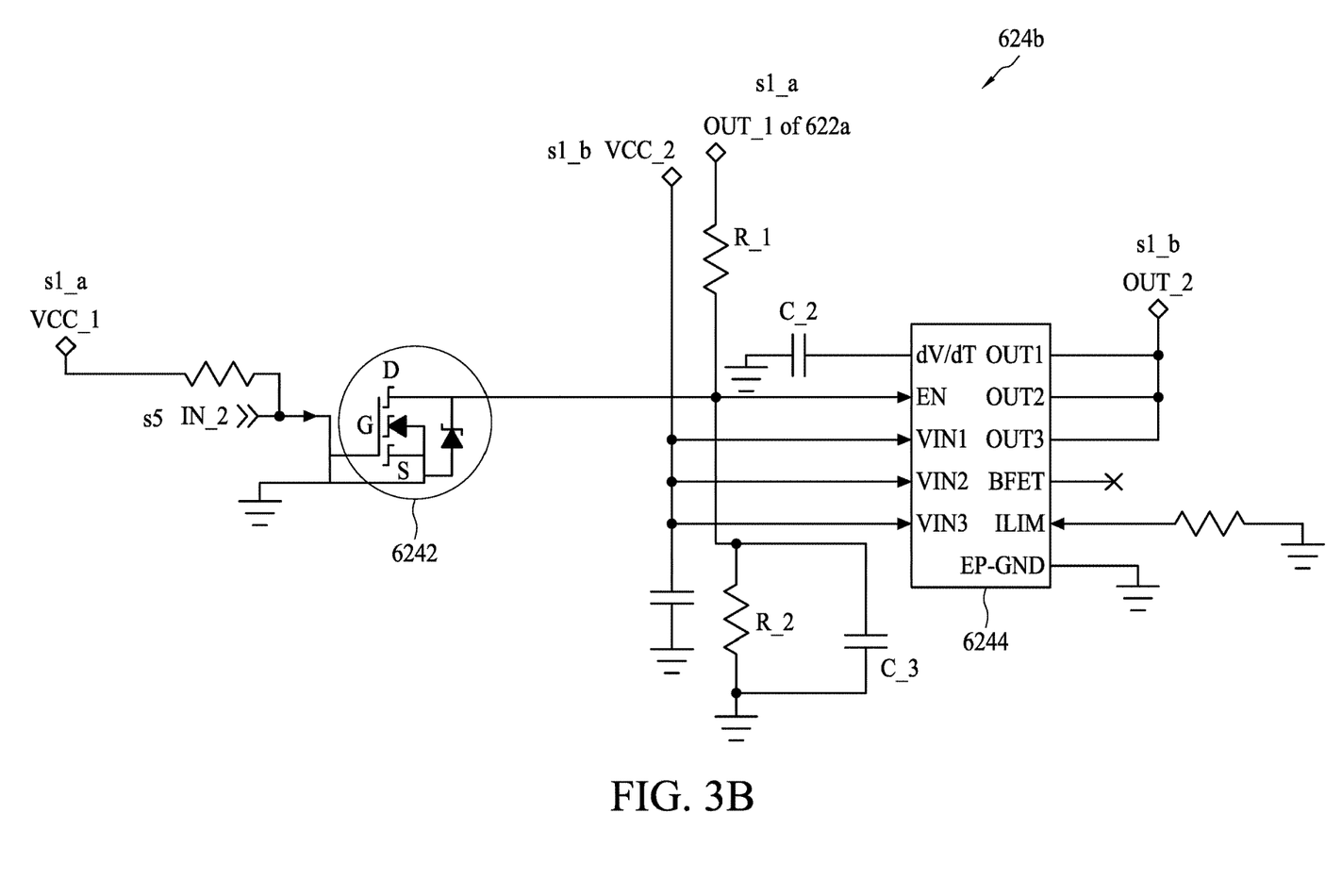
FIG. 3B is a schematic diagram illustrating another switch module according to some embodiments of the present disclosure.

FIG. 3B is a schematic diagram illustrating a switch module according to some embodiments of the present disclosure. The switch module 624b shown in FIG. 3B is identical or similar to the switch module 624a as described and illustrated with reference to FIG. 3. In some embodiments, the switch module 624b shown in FIG. 3B is different from the switch module 624a as described and illustrated with reference to FIG. 3.

Referring to FIG. 3B, the switch module 624b includes an inverter circuit 6242 and a control logic 6244. The switch module 624b is electrically connected to conductive terminals VCC_1, VCC_2, IN_2, OUT_1 and OUT_2, respectively.

The conductive terminal VCC_1 is configured to receive a power signal s1_a from the power supply unit 2.

The conductive terminal VCC_2 is configured to receive a power signal s1_b from the power supply unit 2.

An enable conductive terminal EN of the control logic 6244 may receive a power s1_a signal outputted from the switch module 622a or 622b to enable the control logic 6244.

The conductive terminal OUT_2 is configured to output the power signal s1_b when or subsequent to receiving a signal s5 at the conductive terminal IN_2.

The inverter circuit 6242 is configured to change a voltage level of the signal s5 received from the conductive terminal IN_2. For example, if the signal s5 received from the conductive terminal IN_2 has a relatively low voltage level (e.g. a ground voltage level or logic low), the inverter circuit 6242 may change the relatively low voltage level to a relatively high voltage level (logic high), and vice versa. The relatively high voltage level outputted by the inverter circuit 6242 may trigger the control logic 6244 to output the power signal s1_b at the conductive terminal OUT_2.

The inverter circuit 6242 includes a Metal-Oxide-Semiconductor Field-Effect Transistor (MOSFET). The inverter circuit 6242 includes a diode. Though not illustrated in FIG. 3B, it is contemplated that the inverter circuit 6242 may include more components or be replaced by other inverter circuitry of interest.

Referring to FIG. 3B, a capacitor C_2 is electrically connected to a conductive terminal dV/dT of the control logic 6244. The capacitance of the capacitor C_2 is used to control the rise time of the power signal s1_b outputted from the conductive terminal OUT_2. The capacitance of the capacitor C_2 is designed to comply with a standard or specification of an electronic device. The capacitance of the capacitor C_2 is designed to be compatible with the rise time for different electronic devices. The capacitance of the capacitor C_2 is designed to be compatible with different rise times defined in the specifications of NGSFF SSD and M.2 SSD.

For example, in an M.2 SSD, the rise time of a received power signal may be defined to be greater than 1 millisecond (ms). For example, in an NGSFF SSD, the rise time of a received power signal may be defined to be greater than 1 millisecond. In some embodiments of the subject application, the capacitor C_2 has a capacitance of approximately 0.1 microfarads (μF). In some embodiments of the subject application, the capacitor C_2 has a capacitance to control/facilitate the power signal s1_b to have a rise time of approximately 1.2 milliseconds. The capacitor C_2 has a capacitance to control/facilitate the power signal s1_b to have a rise time which meets the criteria or standard defined in the specification of NGSFF SSD. The capacitor C_2 has a capacitance to control/facilitate the power signal s1_b to have a rise time which meets the criteria or standard defined in the specification of M.2 SSD.

Referring to FIG. 3B, the switch module 624b includes a resistor R_1 connected in series with a resistor R_2. The resistors R_1 and R_2 may function as a voltage divider to provide a suitable bias voltage to the control logic 6244. In addition, the resistor R_2 is connected in parallel with a capacitor C_3. The capacitor C_3 is configured to filter undesired noise. In some embodiments, the control logic 6244 is an eFuse component that can provide over-voltage protection and/or over-current protection.

Figure 4A:
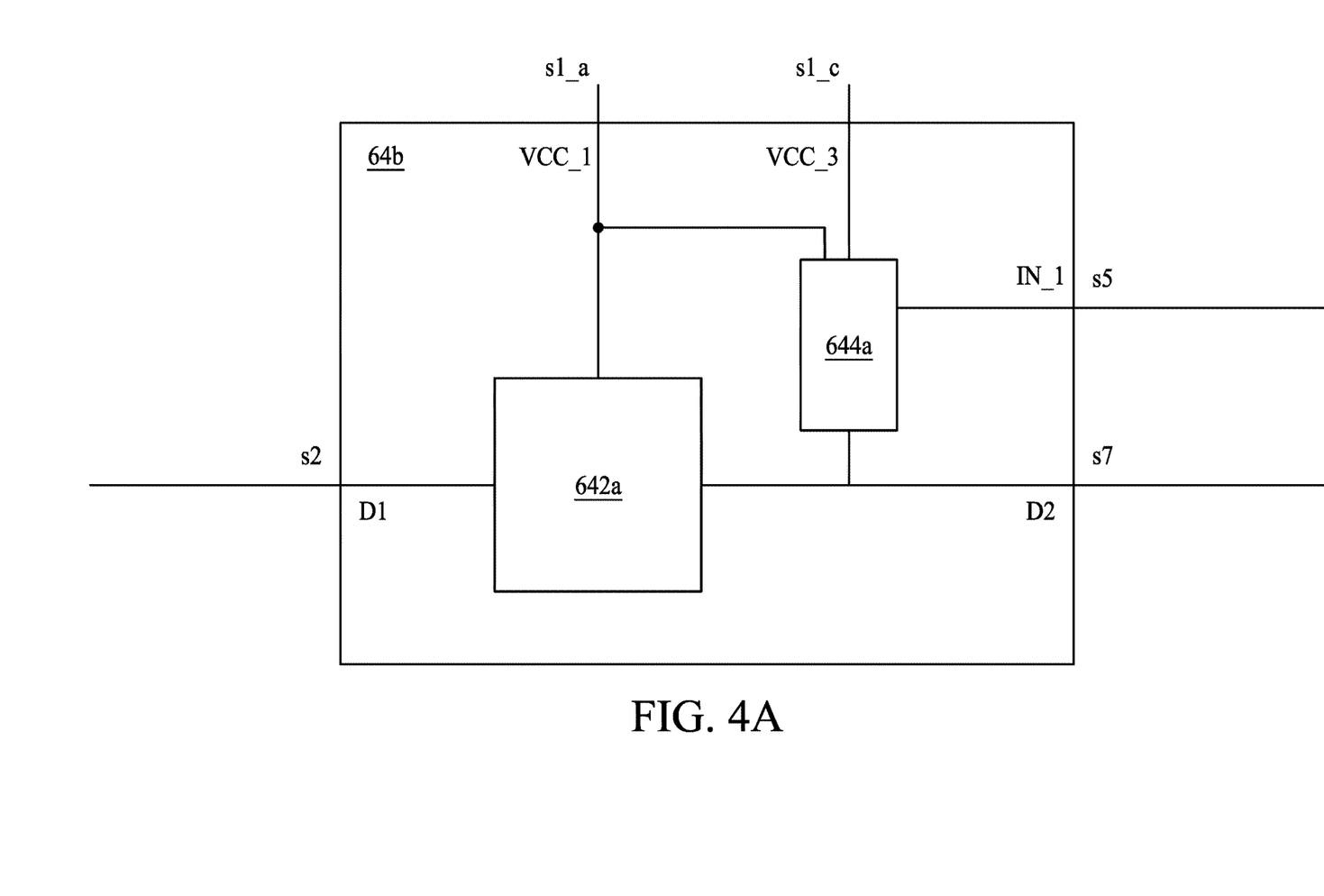
FIG. 4A is a schematic diagram illustrating a switch circuit according to some embodiments of the present disclosure.

FIG. 4A is a schematic diagram illustrating a switch circuit according to some embodiments of the present disclosure. In some embodiments, the switch circuit 64b shown in FIG. 4A is identical or similar to the switch circuit 64a as described and illustrated with reference to FIG. 1B. In some embodiments, the switch circuit 64b shown in FIG. 4A is different from the switch circuit 64a as described and illustrated with reference to FIG. 1B.

Referring to FIG. 4A, the switch circuit 64b includes a control logic 642a and a pull-up circuit 644a.

The control logic 642a may include but is not limited to, for example, a microprocessor that comply with I²C (Inter-Integrated Circuit) protocols. The control logic 642a supports hot swap functionality.

The control logic 642a is electrically connected to the conductive terminals D1, D2 and VCC_1 of the switch circuit 64b, respectively.

The pull-up circuit 644a is electrically connected to the conductive terminals VCC_1, VCC_3, IN_1 and D2 of the switch circuit 64b, respectively.

Although the conductive terminals D1 and D2 in FIG. 4A are respectively illustrated as a single connection for the sake of simplicity, it is contemplated that the conductive terminal D1 may include multiple connections to the processing unit 4, and the conductive terminal D2 may include multiple connections to the connector 8.

The pull-up circuit 644a receives a power signal s1_a from the conductive terminal VCC_1 of the switch circuit 64b. The pull-up circuit 644a receives a power signal s1_c from the conductive terminal VCC_3 of the switch circuit 64b. The pull-up circuit 644a receives a signal s5 from the conductive terminal IN_1 of the switch circuit 64b.

The pull-up circuit 644a is configured to change a voltage level of a signal s7 transmitting between the conductive terminal D2 and the pin P5 of the connector 8 when or subsequent to receiving the signal s5 from the conductive terminal IN_1 of the switch circuit 64b. The voltage level of the signal s7 is changed from a relatively low voltage level to a relatively high voltage level when or subsequent to receiving the signal s5 from the conductive terminal IN_1. In some embodiments, the voltage level of the signal s7 is changed from 1.8 Volts to 3.3 Volts when or after receiving the signal s5 from the conductive terminal IN_1.

Figure 4B:
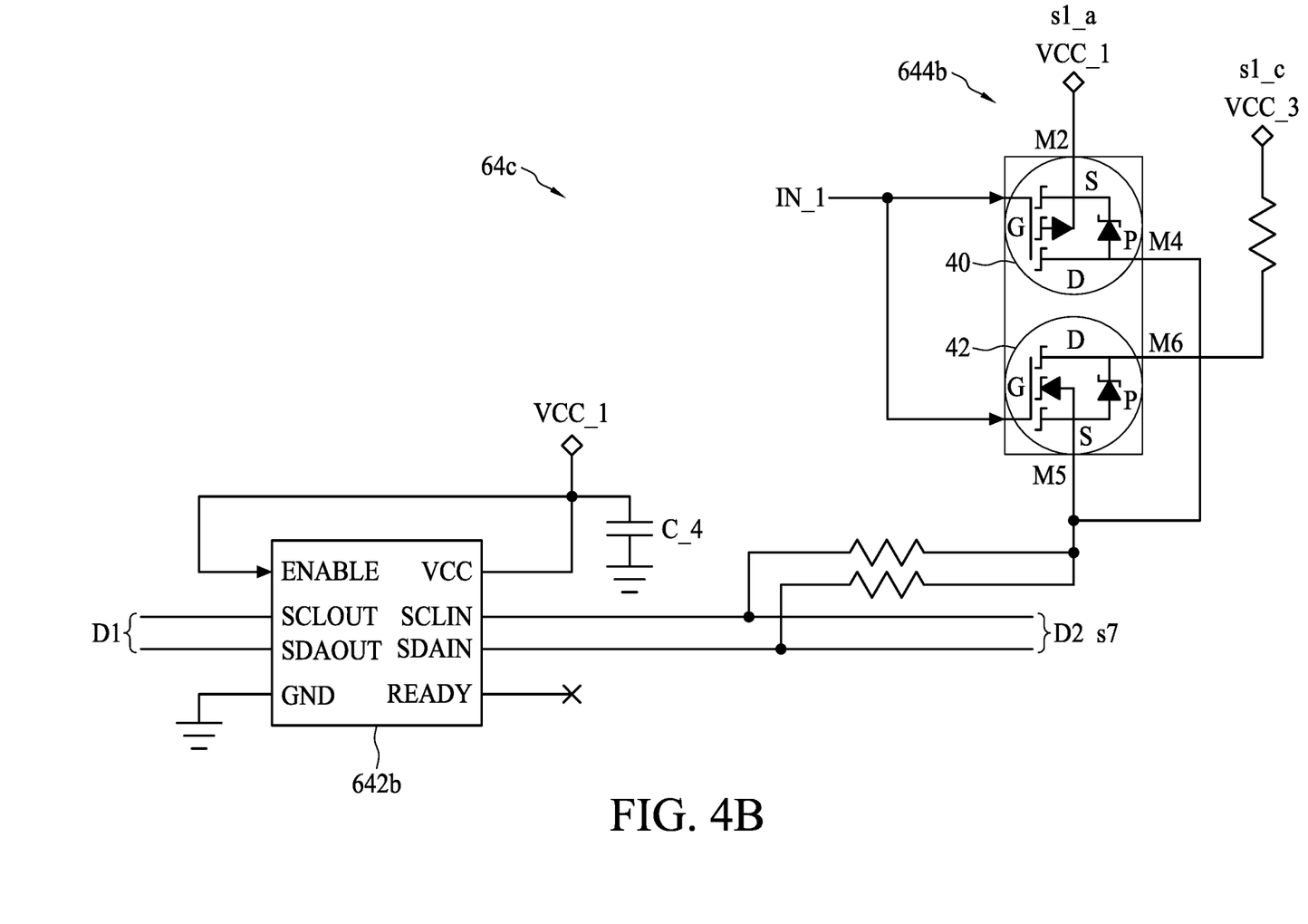
FIG. 4B is a schematic diagram illustrating another switch circuit according to some embodiments of the present disclosure.

FIG. 4B is a schematic diagram illustrating a switch circuit according to some embodiments of the present disclosure. The switch circuit 64c shown in FIG. 4B is identical or similar to the switch circuit 64a as described and illustrated with reference to FIG. 1B. The switch circuit 64c shown in FIG. 4B is identical or similar to the switch circuit 64b as described and illustrated with reference to FIG. 4A. In some embodiments, the switch circuit 64c shown in FIG. 4B is different from the switch circuit 64a as described and illustrated with reference to FIG. 1B. In some embodiments, the switch circuit 64c shown in FIG. 4B is different from the switch circuit 64b as described and illustrated with reference to FIG. 4A.

Referring to FIG. 4B, the switch circuit 64c includes a control logic 642b and a pull-up circuit 644b.

The switch circuit 64c includes a plurality of conductive terminals. The switch circuit 64c includes a capacitor C_4 electrically connected to the conductive terminal VCC_1. The capacitor C_4 is configured to filter the unwanted noise of the power signal received from the conductive terminal VCC_1.

Each of the conductive terminals D1 and D2 provides two or more connection channels. Each of the conductive terminals D1 and D2 provides two or fewer connection channels. Each of the connection channels of the conductive terminal D1 is configured to provide transmission of different signals. Each of the connection channels of the conductive terminal D2 is configured to provide transmission of different signals. Each of the connection channels of the conductive terminal D1 is configured to provide transmission of signals carrying different data or information. Each of the connection channels of the conductive terminal D2 is configured to provide transmission of signals carrying different data or information.

Referring to FIG. 4B, the pull-up circuit 644b includes, for example, two circuits 40 and 42. In some embodiments, the circuit 40 includes a p-type MOSFET and a diode connected between the source and the drain of the p-type MOSFET. The circuit 42 includes a n-type MOSFET and a diode connected between the source and the drain of the n-type MOSFET. The diode of the switch circuit 40 includes but is not limited to, for example, a Zener diode. The diode of the switch circuit 42 includes but is not limited to, for example, a Zener diode.

In one operation, when a signal of a relatively low voltage level (e.g., a ground voltage level or a logic low) is received from the conductive terminal IN_1, the terminals M2 and M4 of the pull-up circuit 644b are electrically connected or turned on while the terminals M5 and M6 of the pull-up circuit 644b are opened or turned off. A voltage level of the signal s7, which is transmitted between the conductive terminal D2 and the pin P5 of the connector 8, is changed in accordance with the power signal received from the conductive terminal VCC_1. A voltage level of the signal s7, which is transmitted between the conductive terminal D2 and the pin P5 of the connector 8, may have a voltage level substantially identical to the voltage level of the power signal s1_a received from the conductive terminal VCC_1.

In another operation, when a signal of a relatively high voltage level (e.g., a logic high) is received at the conductive terminal IN_1, the terminals M2 and M4 are opened or turned off while the terminals M5 and M6 are electrically connected or turned on. A voltage level of the signal s7, which is transmitted between the conductive terminal D2 and the pin P5 of the connector 8, is changed in accordance with the power signal received from the conductive terminal VCC_3. The signal s7, which is transmitted between the conductive terminal D2 and the pin P5 of the connector 8, may have a voltage level substantially identical to the voltage level of the power signal s1_c received from the conductive terminal VCC_3.

Figure 5:
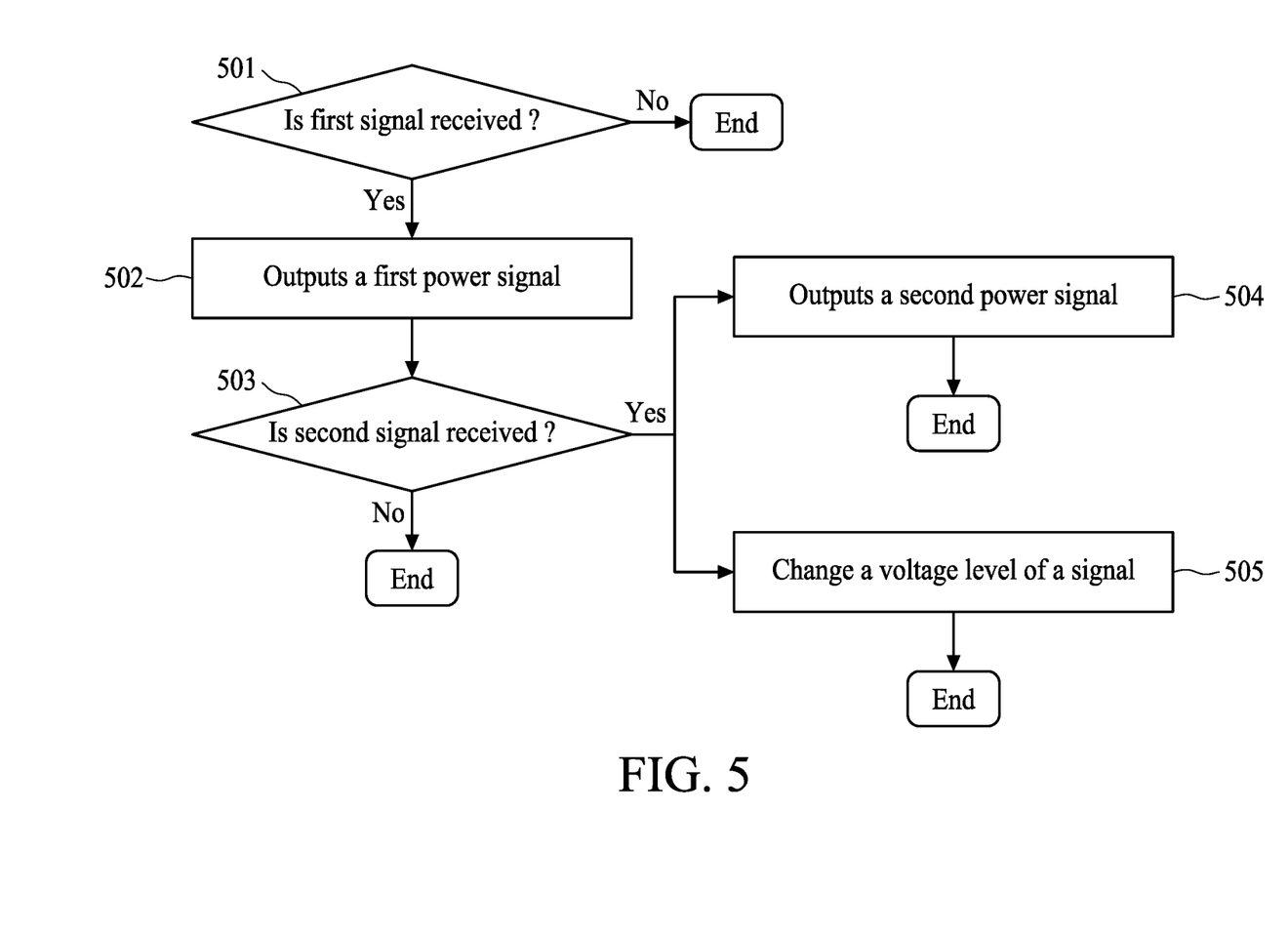
FIG. 5 is a flow chart illustrating some operations according to some embodiments of the present disclosure.

FIG. 5 is a flow chart illustrating some operations according to some embodiments of the present disclosure. In operation 501, a switch circuit may determine whether a first signal is received. The first signal may include but is not limited to, for example, a logic low signal or a signal of a relatively low voltage level. If the first signal is received, in operation 502, a first power signal is outputted from the switch circuit. In operation 503, the switch circuit may determine whether a second signal is received. The second signal may include but is not limited to, for example, a logic low signal or a signal of a relatively low voltage level. If the second signal is received, a second power signal is output in operation 504 while a voltage of a signal is changed in operation 505. The first power signal has a first voltage level and the second power signal has a second voltage level. The first voltage level is different from the second voltage level. The first voltage level is lower than the second voltage level. The first voltage level is approximately 3.3 V. The second voltage level is approximately 12 V. In operation 505, the voltage level of a signal is changed in response to the result of operation 503.

In some embodiments, when an electronic device (e.g. an M.2 SSD) is inserted in or engaged with a connector (e.g. the connector as shown in FIGS. 1A, 1B, 2), a voltage level of a conductive terminal of the connector is pulled down to a relatively low voltage level (e.g. ground voltage level). For example, when an M.2 SSD is inserted in or engaged with the connector 8 of FIG. 1A or 1B, the voltage level of the pin P1 of the connector 8 is pulled down to a relatively low voltage level. For example, when an M.2 SSD is inserted in or engaged with the connector 8a of FIG. 2, the voltage level of the pin P1 is pulled down to a relatively low voltage level.

When or after the voltage level of the conductive terminal of the connector is pulled down to a relatively low voltage level, a switch circuit may receive a first signal of the relatively low voltage level from the connector. For example, the switch circuit 6a of FIG. 1A will receive a signal s3 from the connector 8 at the conductive terminal T3. For example, the switch circuit 6b of FIG. 1B will receive a signal s3 from the connector 8 at the conductive terminal T3. For example, the switch module 622a of FIG. 3 will receive a signal s3 from the connector 8 at the conductive terminal IN_1. For example, the switch module 622b of FIG. 3A will receive a signal s3 from the connector 8 at the conductive terminal IN_1.

When or after receiving the first signal of the relatively low voltage level from the connector, the switch circuit may output a power signal of a first voltage level to the connector. For example, when or after receiving the signal s3 from the connector 8 of FIG. 1A, the switch circuit 6a outputs a power signal s4 to the connector 8. For example, when or after receiving the signal s3 from the connector 8 of FIG. 1B, the switch circuit 6b outputs a power signal s1_a to the connector 8. For example, when or after receiving the signal s3 from the connector 8, the switch module 622a of FIG. 3 outputs a power signal s1_a to the connector 8. For example, when or after receiving the signal s3 from the connector 8, the switch module 622b of FIG. 3A outputs a power signal s1_a to the connector 8.

In some embodiments, when an M.2 SSD is inserted in or engaged with a connector, a voltage level of a conductive terminal of the connector will remain unchanged. For example, when an M.2 SSD is inserted in or engaged with the connector 8 of FIG. 1A or 1B, the voltage level of the pin P3 will remain unchanged. For example, when an M.2 SSD is inserted in or engaged with the connector 8a of FIG. 2, the voltage level of the pin P1 will remain unchanged. For example, the voltage level of the signal s5 remains at a relatively high voltage level. In response to a voltage level of a conductive terminal of the connector (which remains unchanged), the switch circuit does not output a power signal of a relatively high voltage to the connector but provides a power signal of a relatively low voltage level to the connector to protect the M.2 SSD (which consumes power of a relatively low voltage to work) from damage. For example, when an M.2 SSD is inserted in or engaged with the connector 8 of FIG. 1A or 1B, the switch circuit 6a of FIG. 1A does not output a power signal s6 to the connector 8. For example, when an M.2 SSD is inserted in or engaged with the connector 8 of FIG. 1A or 1B, the switch circuit 6b of FIG. 1B does not output a power signal s6 to the connector 8. For example, when an M.2 SSD is inserted in or engaged with the connector 8 of FIG. 1A or 1B, the switch circuit 62b of FIG. 3 does not output a power signal s1_b to the connector 8.

In some embodiments, when an M.2 SSD is inserted in or engaged with a connector, the switch circuit does not change a voltage level of a signal provided to the connector. By keeping a relatively low voltage level of the signal provided to the connector, the switch circuit can protect the M.2 SSD from damage. For example, when an M.2 SSD is inserted in or engaged with the connector 8 of FIG. 1A, a voltage level of the signal s7 is not changed by the switch circuit 6a. For example, when an M.2 SSD is inserted in or engaged with the connector 8 of FIG. 1B, a voltage level of the signal s7 is not changed by the switch circuit 6b. For example, when an M.2 SSD is inserted in or engaged with the connector 8 of FIG. 1B, a voltage level of the signal s7 is not changed by the switch circuit 64a. For example, when an M.2 SSD is inserted in or engaged with the connector 8 of FIG. 1B, a voltage level of the signal s7 is not changed by the switch circuit 64b of FIG. 4A. For example, when an M.2 SSD is inserted in or engaged with the connector 8 of FIG. 1B, a voltage level of the signal s7 is not changed by the pull-up circuit 644a of FIG. 4A.

In another embodiment, when an NGSFF SSD is inserted in or engaged with a connector, a voltage level of a conductive terminal of the connector will be pulled down to a relatively low voltage level (e.g. ground voltage level). For example, when an NGSFF SSD is inserted in or engaged with the connector 8 of FIG. 1A or 1B, the voltage level of the pin P1 will be pulled down to a relatively low voltage level. For example, when an NGSFF SSD is inserted in or engaged with the connector 8a of FIG. 2, the voltage level of the pin P1 will be pulled down to a relatively low voltage level.

When or after the voltage level of the conductive terminal of the connector is pulled down to a relatively low voltage level, a switch circuit will receive a signal of a relatively low voltage level from the connector. For example, the switch circuit 6a of FIG. 1A receives a signal s3 of a relatively low voltage level from the connector 8 at the conductive terminal T3. For example, the switch circuit 6b of FIG. 1B receives a signal s3 of a relatively low voltage level from the connector 8 at the conductive terminal T3. For example, the switch module 622a of FIG. 3 receives a signal s3 of a relatively low voltage level from the connector 8 at the conductive terminal IN_1. For example, the switch module 622b of FIG. 3A receives a signal s3 of a relatively low voltage level from the connector 8 at the conductive terminal IN_1.

When or after receiving the signal of the relatively low voltage level from the connector, the switch circuit outputs a power signal of a relatively low voltage level to the connector. For example, when or after receiving the signal s3 from the connector 8 of FIG. 1A, the switch circuit 6a outputs a power signal s4 of a relatively low voltage level to the connector 8. For example, when or after receiving the signal s3 from the connector 8 of FIG. 1B, the switch circuit 6b outputs a power signal s1_a of a relatively low voltage level to the connector 8. For example, when or after receiving the signal s3 from the connector 8, the switch module 622a of FIG. 3 outputs a power signal s1_a of a relatively low voltage level to the connector 8. For example, when or after receiving the signal s3 from the connector 8, the switch module 622b of FIG. 3A outputs a power signal s1_a of a relatively low voltage level to the connector 8.

When an NGSFF SSD is inserted in or engaged with a connector, a voltage level of a conductive terminal of the connector will be pulled down to a relatively low voltage level (e.g. ground voltage level). For example, when an NGSFF SSD is inserted in or engaged with the connector 8 of FIG. 1A or 1B, the voltage level of the pin P3 will be pulled down to a relatively low voltage level. For example, when an NGSFF SSD is inserted in or engaged with the connector 8a of FIG. 2, the voltage level of the pin P3 is pulled down to a relatively low voltage level. When or after the voltage level of the conductive terminal of the connector is pulled down to a relatively low voltage level, a switch circuit will receive a signal of a relatively low voltage level from the connector. For example, the switch circuit 6a of FIG. 1A may receive a signal s5 of a relatively low voltage level from the connector 8 at the conductive terminal 15. For example, the switch circuit 6b of FIG. 1B may receive a signal s5 of a relatively low voltage level from the connector 8 at the conductive terminal 15. For example, the switch module 624a of FIG. 3 may receive a signal s5 of a relatively low voltage level from the connector 8 at the conductive terminal IN_2. For example, the switch module 624b of FIG. 3B may receive a signal s5 of a relatively low voltage level from the connector 8 at the conductive terminal IN_2.

When or after receiving the signal of the relatively low voltage level from the connector, the switch circuit outputs a power signal of a relatively high voltage level to the connector. For example, when or after receiving the signal s5 from the connector 8 of FIG. 1A, the switch circuit 6a outputs a power signal s6 of a relatively high voltage level to the connector 8. For example, when or after receiving the signal s5 from the connector 8 of FIG. 1B, the switch circuit 6b outputs a power signal s1_b of a relatively high voltage level to the connector 8. For example, when or after receiving the signal s5 from the connector 8, the switch module 624a of FIG. 3 outputs a power signal s1_b of a relatively high voltage level to the connector 8. For example, when or after receiving the signal s5 of the relatively low voltage level from the connector 8, the inverter circuit 6242 of FIG. 3B changes the voltage level of the signal s5 to a relatively high voltage level and outputs it to the control logic 6244. The control logic 6244 will then be triggered to output a power signal s1_b of a relatively high voltage level to the connector 8.

When or after receiving the signal of the relatively low voltage level from the connector, the switch circuit will change a voltage level of a signal provided to the connector. For example, when or after receiving the signal s5 from the connector 8 of FIG. 1A, a voltage level of the signal s7 is changed by the switch circuit 6a. For example, when or after receiving the signal s5 from the connector 8 of FIG. 1B, a voltage level of the signal s7 is changed by the switch circuit 6b. For example, when or after receiving the signal s5 from the connector 8 of FIG. 1B, a voltage level of the signal s7 is changed by the switch circuit 64a. For example, when or after receiving the signal s5 from the connector 8 of FIG. 1B, a voltage level of the signal s7 is changed by the switch circuit 64b of FIG. 4A. For example, when or after receiving the signal s5 from the connector 8 of FIG. 1B, a voltage level of the signal s7 is changed by the pull-up circuit 644a of FIG. 4A.

Figure 6:
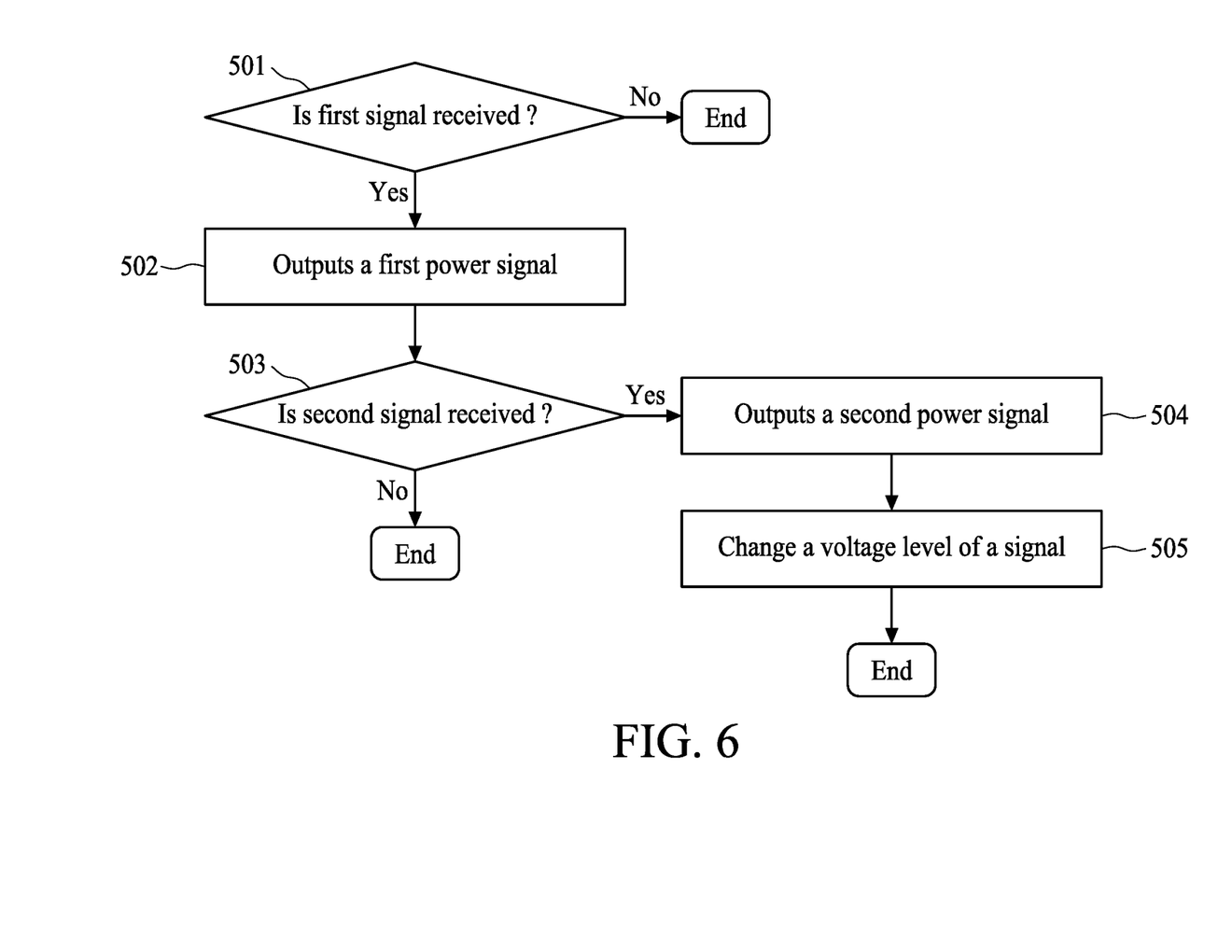
FIG. 6 is a flow chart illustrating some operations according to some embodiments of the present disclosure.

FIG. 6 is a flow chart illustrating some operations according to some embodiments of the present disclosure. The flow chart as shown FIG. 6 is similar to the flow chart as described and illustrated with reference to FIG. 5, except that the operation 505 is performed subsequent to the operation 504.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "substantially," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A switch circuit, comprising:
    a first conductive terminal configured to receive a first signal from a first pin of a connector;
    a second conductive terminal configured to receive a second signal from a second pin of the connector;
    a third conductive terminal electrically connected to a third pin of the connector; and
    a fourth conductive terminal electrically connected to a fourth pin of the connector,
    wherein the third conductive terminal outputs a first power signal of a first voltage level to the third pin of the connector upon receiving the first signal from the first pin of the connector, and wherein the fourth conductive terminal outputs a second power signal of a second voltage level to the fourth pin of the connector upon receiving the second signal from the second pin of the connector, wherein the second voltage level is different from the first voltage level.

2. The switch circuit of claim 1, further comprising:
    a fifth conductive terminal electrically connected to a fifth pin of the connector to provide transmission of a third signal between the fifth conductive terminal and the fifth pin of the connector; and
    a sixth conductive terminal electrically connected to a processing unit to provide transmission of a fourth signal between the sixth conductive terminal and the processing unit,
    wherein a voltage level of the third signal is changed upon receiving the second signal.

3. The switch circuit of claim 1, wherein when the switch circuit receives the second signal, the third pin of the connector receives the first power signal while the fourth pin of the connector receives the second power signal.

4. The switch circuit of claim 2, further comprising a seventh conductive terminal electrically connected to a power supply unit, wherein the power supply unit is configured to provide power signals of various voltage levels.

5. The switch circuit of claim 4, further comprising:
    a first switch circuit electrically connected to the first conductive terminal, the second conductive terminal, the third conductive terminal, the fourth conductive terminal and the seventh conductive terminal, wherein the first switch circuit outputs the first power signal to the third pin of the connector upon receiving the first signal and outputs the second power signal to the fourth pin of the connector upon receiving the second signal.

6. The switch circuit of claim 4, further comprising a second switch circuit electrically connected to the second conductive terminal, the fifth conductive terminal, the sixth conductive terminal and the seventh conductive terminal.

7. The switch circuit of claim 6, wherein the second switch circuit changes the voltage level of the third signal upon receiving the second signal from the second conductive terminal.

8. The switch circuit of claim 2, wherein the third signal comprises information regarding an electronic device electrically connected to the connector, the information comprising at least one of: model name, serial number, temperature, power consumption, or capability of the electronic device.

9. The switch circuit of claim 1, wherein the third conductive terminal outputs the first power signal of the first voltage level to the third pin of the connector in response to the first signal being a ground level signal, and wherein the fourth conductive terminal outputs the second power signal of the second voltage level to the fourth pin of the connector in response to the second signal being a ground level signal.

10. The switch circuit of claim 6, wherein the second switch circuit changes the voltage level of the third signal when the second signal is a ground level signal.

11. A method of operating a switch circuit, comprising:
receiving, at a first conductive terminal of the switch circuit, a first signal from a first pin of a connector;
receiving, at a second conductive terminal of the switch circuit, a second signal from a second pin of the connector;
outputting, at a third conductive terminal of the switch circuit, a first power signal of a first voltage level to a third pin of the connector upon receiving the first signal from the first pin of the connector, and outputting, at a fourth conductive terminal of the switch circuit, a second power signal of a second voltage level to a fourth pin of the connector upon receiving the second signal from the second pin of the connector, wherein the second voltage level is different from the first voltage level.

12. The method of claim 11, further comprising:
providing transmission of a third signal between a fifth pin of the connector and a processing unit, and
changing a voltage level of the third signal upon receiving the second signal at the second conductive terminal from the second pin of the connector.

13. The method of claim 11, further comprising providing both the first power signal and the second power signal upon receiving the second signal.

14. The method of claim 11, further comprising outputting the first power signal of the first voltage level in response to the first signal being a ground level signal, and outputting the second power signal of the second voltage level in response to the second signal being a ground level signal.

15. A switch circuit, comprising:
a first switch circuit electrically connected to a first conductive terminal, a second conductive terminal, a third conductive terminal and a fourth conductive terminal of the switch circuit, and
wherein the first switch circuit outputs a first power signal of a first voltage level to the third conductive terminal upon receiving a first signal from the first conductive terminal, and wherein the first switch circuit outputs a second power signal of a second voltage level to the fourth conductive terminal upon receiving a second signal from the second conductive terminal, wherein the second voltage level is different from the first voltage level.

16. The switch circuit of claim 15, further comprising:
a second switch circuit electrically connected to the second conductive terminal and a fifth conductive terminal of the switch circuit; wherein
the second switch circuit is configured to change a voltage level of a third signal upon receiving the second signal from the second conductive terminal.

17. The switch circuit of claim 15, wherein the first switch circuit is electrically connected to a sixth conductive terminal and a seventh conductive terminal of the switch circuit, and wherein the first switch circuit is configured to receive the first power signal from the sixth conductive terminal and the second power signal from the seventh conductive terminal of the switch circuit.

18. The switch circuit of claim 16, wherein the second switch circuit is electrically connected to the sixth conductive terminal and an eighth conductive terminal of the switch circuit, and wherein the second switch circuit is configured to receive the first power signal from the sixth conductive terminal and a third power signal from the eighth conductive terminal of the switch circuit.

19. The switch circuit of claim 18, wherein a voltage level of the first power signal is different from a voltage level of the third power signal.

20. The switch circuit of claim 18, wherein a voltage level of the second power signal is different from a voltage level of the third power signal.

* * * * *